(12) United States Patent
Guo

(10) Patent No.: US 11,341,907 B2
(45) Date of Patent: May 24, 2022

(54) OLED DRIVE CIRCUIT AND MANUFACTURING METHOD THEREOF, AND DISPLAY DEVICE

(71) Applicant: CHANGCHUN FLEXIBLE DISPLAY TECHNOLOGY CO., LTD., Jilin (CN)

(72) Inventor: Xiaodong Guo, Jilin (CN)

(73) Assignee: CHANGCHUN FLEXIBLE DISPLAY TECHNOLOGY CO., LTD., Changchun (CN)

( * ) Notice: Subject to any disclaimer, the term of this patent is extended or adjusted under 35 U.S.C. 154(b) by 0 days.

(21) Appl. No.: 16/322,893

(22) PCT Filed: Jun. 2, 2016

(86) PCT No.: PCT/CN2016/084505
§ 371 (c)(1),
(2) Date: Feb. 1, 2019

(87) PCT Pub. No.: WO2017/206141
PCT Pub. Date: Dec. 7, 2017

(65) Prior Publication Data
US 2019/0213954 A1   Jul. 11, 2019

(51) Int. Cl.
*G09G 3/3233* (2016.01)
*H01L 29/786* (2006.01)
(Continued)

(52) U.S. Cl.
CPC ............ *G09G 3/3233* (2013.01); *G09G 3/32* (2013.01); *G09G 3/3266* (2013.01);
(Continued)

(58) Field of Classification Search
CPC ...... G09G 3/32; G09G 3/3225; G09G 3/3233; G09G 3/3266; G09G 2300/0426;
(Continued)

(56) References Cited

U.S. PATENT DOCUMENTS 6,528,816 B1    3/2003  Jackson et al.
2006/0102900 A1  5/2006  Shin et al.
(Continued)

FOREIGN PATENT DOCUMENTS

CN    1411322 A    4/2003
CN    1412854 A    4/2003
(Continued)

OTHER PUBLICATIONS

Yang et al. (Weak epitaxy growth of organic semiconductor thin films, May 27, 2009, Chemical Society Reviews, 38, 2634-2645).*

*Primary Examiner* — Stacy Khoo
(74) *Attorney, Agent, or Firm* — Mei & Mark LLP; Manni Li

(57) ABSTRACT

There is provided an organic light-emitting diode drive circuit comprising a switch transistor ($T_1$), a drive transistor ($T_2$), a storage capacitor (C), and an organic light-emitting diode (OLED), wherein the switch transistor ($T_1$) uses an inorganic semiconductor transistor, and the drive transistor ($T_2$) uses an organic semiconductor transistor. A display screen adopting the drive circuit as a unit pixel has the property of uniform brightness. In addition, there is provided a method of fabricating the drive circuit and a display device using the drive circuit.

2 Claims, 6 Drawing Sheets

(51) Int. Cl.
*G09G 3/32* (2016.01)
*G09G 3/3266* (2016.01)
*H01L 27/12* (2006.01)
*H01L 27/32* (2006.01)
*H01L 51/05* (2006.01)

(52) U.S. Cl.
CPC ...... *H01L 27/1225* (2013.01); *H01L 27/1288* (2013.01); *H01L 27/3276* (2013.01); *H01L 29/786* (2013.01); *G09G 2300/0426* (2013.01); *G09G 2300/0809* (2013.01); *G09G 2320/0233* (2013.01); *H01L 29/7869* (2013.01); *H01L 29/78663* (2013.01); *H01L 51/0512* (2013.01)

(58) Field of Classification Search
CPC .... G09G 2300/0809; G09G 2320/0233; H01L 27/1225; H01L 27/1288; H01L 27/286; H01L 27/3274; H01L 27/3276; H01L 29/786; H01L 29/78663; H01L 29/7869; H01L 51/0512
See application file for complete search history.

(56) References Cited

U.S. PATENT DOCUMENTS

| | | |
|---|---|---|
| 2008/0157067 A1 | 7/2008 | Shiba et al. |
| 2009/0267075 A1 | 10/2009 | Wang et al. |
| 2010/0001284 A1 | 1/2010 | Cho et al. |
| 2011/0127504 A1 | 6/2011 | Halls et al. |
| 2014/0175393 A1* | 6/2014 | Beak .................. H01L 27/3265 257/40 |
| 2015/0236079 A1 | 8/2015 | Choi |
| 2015/0236282 A1* | 8/2015 | Afzali-Ardakani ......... H01L 27/3274 257/40 |
| 2016/0087022 A1 | 3/2016 | Tsai et al. |
| 2016/0171928 A1 | 6/2016 | Gai et al. |

FOREIGN PATENT DOCUMENTS

| | | | |
|---|---|---|---|
| CN | 1870113 A | 11/2006 | |
| CN | 102867481 A | 1/2013 | |
| CN | 104409047 A | 3/2015 | |
| WO | WO-2004040657 A1 * | 5/2004 | ......... H01L 51/0512 |

* cited by examiner

OLED DRIVE CIRCUIT AND MANUFACTURING METHOD THEREOF, AND DISPLAY DEVICE

CROSS-REFERENCE TO RELATED APPLICATIONS

The subject application is a U.S. national stage of PCT/CN2016/084505 filed on Jun. 2, 2016. The contents and subject matter of the PCT international application is incorporated herein by reference.

TECHNICAL FIELD

The invention relates to an organic light-emitting diode (OLED) drive circuit, particularly an active-matrix driving organic light-emitting diode (AMOLED) drive circuit, a method of fabricating the same, and a display device using the same.

BACKGROUND OF THE INVENTION

Organic light-emitting diodes have advantages such as low driving voltage, high luminous brightness and luminous efficiency, fast response speed, wide work temperature range, simple forming process, adaptation to large-scale large-area processing, and good compatibility with flexible substrates, and thus have become core devices in new generation display devices. The driving modes of OLED can be categorized into passive-matrix driving and active-matrix driving. Among others, active-matrix driving OLEDs have advantages such as wide viewing angle, high brightness, and fast response speed. Active-matrix driving organic light-emitting diode-based display screens has been used for advanced mobile phones and televisions.

An AMOLED display screen is composed of several regions capable of independently emitting light, and each of the smallest regions capable of independently emitting light is referred to as a unit pixel. In the early stage of laboratory development, each unit pixel of an AMOLED includes at least one switch transistor $T_1$, one drive transistor $T_2$, one storage capacitor C, and one OLED, and the circuit structure formed by their interconnection is referred to as a 2T1C structure. 2T1C circuit has advantages such as simple structure, simple processing, and high yield, and thus is widely used in R&D stage.

However, OLEDs are current-type devices. To achieve the uniformity of display brightness of AMOLED display screens, it is necessary that the magnitude of the current flowing through each of pixels is as identical and stable as possible. 2T1C circuits are voltage-controlled circuits, so it is needed to convert input voltage signals to output current signals to drive and control OLEDs. In order to achieve the stability and uniformity of the output current signal, the conversion process presents more stringent requirements for the performance of transistor devices in AMOLED display screens.

Chinese patent CN1870113A and Chinese patent CN1411322A disclose 2T1C drive circuits for AMOLEDs, employing a silicon semiconductor transistor and an organic semiconductor transistor, respectively. However, the above patents do not solve the technical problem present in the current 2T1C circuits, i.e., the technical problem regarding the stability and uniformity of the conversion of voltage signals to current signals in each unit pixel in AMOLEDs.

Moreover, in the commercialization of AMOLEDs, the use of the current 2T1C circuit structures exhibits more apparent drawbacks, for example, particularly the failure of use in large-size display screens, such as computer monitors and televisions. Therefore, the use of 2T1C structures in the current AMOLED commercial products actually has been given up.

Mostly at the present, more complicated compensating circuits (such as multi-T1C circuits) are used to provide constant, uniform currents for OLEDs, in order to solve the technical problem present in the current 2T1C circuits. For example, Chinese patent CN1412854A provides a 3T1C drive circuit; Chinese patent CN103218970A even provides a more complicated 6T1C drive circuit, etc. However, these complicated circuits lead to complex production process, reduced yield, poor batch reliability, and high product costs.

Therefore, there is still a need to develop a new OLED drive circuit, which does not have the above-mentioned technical problem present in the current 2T1C circuits, and in particular, makes the display brightness of large size display screens uniform and is simple in production process.

SUMMARY OF THE INVENTION

In view of the technical problem that prior art AMOLED drive circuits are complicated (for example, multi-T1C) and 2T1C drive circuits cannot meet the need of AMOLED driving, the inventors have unexpectedly discovered that the new 2T1C drive circuit provided by the invention can be adopted to avoid many drawbacks such as complex production process caused by complicated drive circuits and overcome the technical problem present for prior art 2T1C drive circuits, and can ideally meet the need of AMOLED driving.

A first aspect of the invention provides an active-matrix driving organic light-emitting diode drive circuit comprising a switch transistor $T_1$, a drive transistor $T_2$, a storage capacitor C, and an organic light-emitting diode OLED, wherein the semiconductor layer of the switch transistor $T_1$ is of an inorganic semiconductor material, and the semiconductor layer of the drive transistor $T_2$ is of an organic semiconductor material.

Preferably, the inorganic semiconductor material comprises, but is not limited to, any of microcrystalline silicon, amorphous silicon, or a compound semiconductor.

Preferably, the organic semiconductor material may be an organic small molecule semiconductor and a polymer semiconductor.

Preferably, the semiconductor layer of the drive transistor $T_2$ is fabricated by weak epitaxy growth.

Preferably, the switch transistor $T_1$ and the drive transistor $T_2$ transport different types of carriers (electrons or holes), respectively.

In the active-matrix driving organic light-emitting diode drive circuit, each of the switch transistor $T_1$ and the drive transistor $T_2$ have three electrodes, specifically including a gate, a first electrode, and a second electrode; the storage capacitor C has two electrodes, a first electrode and a second electrode; the OLED has two electrodes, a first electrode and a second electrode.

According to some embodiments, the active-matrix driving organic light-emitting diode drive circuit of the first aspect employs the first or the second connection mode as described below.

The first connection mode may be as follows: a gate of the switch transistor $T_1$ is connected with a scan line, a first electrode of the switch transistor $T_1$ is connected with a signal line, a second electrode of the switch transistor $T_1$ is connected with both a gate of the drive transistor $T_2$ and a first electrode of the storage capacitor C, a first electrode of the drive transistor $T_2$ is connected with both a second electrode of the storage capacitor C and a power line, and a second electrode of the drive transistor $T_2$ is connected with a first electrode of the OLED.

The second connection may be as follows: a gate of the switch transistor $T_1$ is connected with a scan line, a first electrode of the switch transistor $T_1$ is connected with a signal line, a second electrode of the switch transistor $T_1$ is connected with both a gate of the drive transistor $T_2$ and a first electrode of the storage capacitor C, a first electrode of the drive transistor $T_2$ is connected with a second electrode of the storage capacitor C, a second electrode of the drive transistor $T_2$ is connected with a first electrode of the OLED, and a second electrode of the OLED is connected with a power line.

A second aspect of the invention provides a method of fabricating drive circuits adopting the above connection modes.

The method for fabricating an organic light-emitting diode drive circuit adopting the first connection mode may comprise:

depositing one or more layers of a conductive metal or metal alloy on a glass substrate by magnetron sputtering; processing the conductive metal or metal alloy into a desired pattern as the scan line and the gate of the switch transistor $T_1$ by mask lithography;

processing an insulating layer by magnetron sputtering or chemical vapor deposition, and forming a via by mask lithography;

fabricating an inorganic semiconductor layer by methods such as magnetron sputtering or chemical vapor deposition or solution processing, and proceeding the inorganic semiconductor layer into a desired pattern as the semiconductor layer of the switch transistor $T_1$ by mask lithography;

depositing a layer of a conductive metal by magnetron sputtering, processing the conductive metal into a desired pattern as the signal line, the power line, the first electrode and the second electrode of the switch transistor $T_1$, the first electrode of the storage capacitor C, and the gate of the drive transistor $T_2$ by mask lithography;

processing an insulating layer by magnetron sputtering or chemical vapor deposition, and forming a via by mask lithography;

fabricating an organic semiconductor layer by weak epitaxy growth, processing the organic semiconductor layer into a desired pattern as the semiconductor layer of the drive transistor $T_2$ by mask lithography;

fabricating a layer of a conductive metal or metal alloy by techniques such as physical vapor deposition or magnetron sputtering, and fabricating the conductive metal or metal alloy into a desired pattern as the first electrode and the second electrode of the drive transistor $T_2$ and the second electrode of the storage capacitor C by mask lithography;

fabricating a dielectric layer by methods such as magnetron sputtering or chemical vapor deposition or physical vapor deposition or solution processing, and processing the dielectric layer to form a via by mask photolithography, so as to connect the second electrode of the drive transistor $T_2$ with the first electrode of the OLED;

depositing a layer of a transparent conductive metal or semiconductor by techniques such as magnetron sputtering or solution processing, and processing the transparent conductive metal or semiconductor into a desired pattern as the first electrode of the OLED by mask lithography;

forming a semiconductor layer of the OLED by methods such as physical vapor deposition or solution processing or inkjet printing;

fabricating a layer of a conductive metal or metal alloy as the second electrode of the OLED by techniques such as physical vapor deposition or magnetron sputtering; and integrally packaging the AMOLED display screen.

The method for fabricating an organic light-emitting diode drive circuit adopting the second connection mode may comprise:

depositing one or more layers of a conductive metal or metal alloy on a glass substrate by magnetron sputtering; processing the conductive metal or metal alloy into a desired pattern as the scan line and the gate of the switch transistor $T_1$ by mask lithography;

processing an insulating layer by magnetron sputtering or chemical vapor deposition, and forming a via by mask lithography;

fabricating an inorganic semiconductor layer by methods such as magnetron sputtering or chemical vapor deposition or solution processing, and proceeding the inorganic semiconductor layer into a desired pattern as the semiconductor layer of the switch transistor $T_1$ by mask lithography;

depositing a layer of a conductive metal by magnetron sputtering, processing the conductive metal into a desired pattern as the signal line, the power line, the first electrode and the second electrode of the switch transistor $T_1$, the first electrode of the storage capacitor C, and the gate of the drive transistor $T_2$ by mask lithography;

processing an insulating layer by magnetron sputtering or chemical vapor deposition, and forming a via by mask lithography;

fabricating an organic semiconductor layer by weak epitaxy growth, processing the organic semiconductor layer into a desired pattern as the semiconductor layer of the drive transistor $T_2$ by mask lithography;

fabricating a layer of a conductive metal or metal alloy by techniques such as physical vapor deposition or magnetron sputtering, and fabricating the conductive metal or metal alloy into a desired pattern as the first electrode and the second electrode of the drive transistor $T_2$ and the second electrode of the storage capacitor C by mask lithography;

fabricating a dielectric layer by methods such as magnetron sputtering or chemical vapor deposition or physical vapor deposition or solution processing, and processing the dielectric layer to form a via by mask photolithography, so as to connect the second electrode of the drive transistor $T_2$ with the first electrode of the OLED;

depositing a layer of a conductive metal or metal alloy by techniques such as physical vapor deposition or magnetron sputtering, and processing the conductive metal or metal alloy into a desired pattern as the first electrode of the OLED by mask lithography;

forming a semiconductor layer of the OLED by methods such as physical vapor deposition or solution processing or inkjet printing;

depositing a layer of a transparent conductive metal or semiconductor as the second electrode of the OLED by techniques such as magnetron sputtering or physical vapor deposition; and integrally packaging the AMOLED display screen.

A third aspect of the invention further provides a display device comprising an AMOLED, wherein the above active-matrix driving organic light-emitting diode drive circuit is used as the unit pixel of the AMOLED.

The 2T1C circuit structure provided by the invention can effectively convert input voltage signals to stable and uniform current signals in a large size (for example, 370 mm×470 mm) AMOLED display screen, such that the brightness of each of the unit pixels on the display screen is uniform. Furthermore, the use of the 2T1C structure provided by the invention can simplify production process, improve product yield and batch reliability, and reduce costs.

The above summary of the invention of the disclosure is not intended to describe each of the disclosed embodiments or every embodiment of the disclosure. More specific exemplary embodiments are described below. Therefore, it would be appreciated that the drawings and the following description are for illustrative purpose only and do not improperly limit the scope of the present disclosure in a certain way.

BRIEF DESCRIPTION OF THE DRAWINGS

FIG. 5A shows step (1) of the method; FIG. 5B shows step (2) of the method; FIG. 5C shows step (3) of the method; FIG. 5D shows step (4) of the method; FIG. 5E shows step (5) of the method; FIG. 5F shows step (6) of the method; FIG. 5G shows step (7) of the method; FIG. 5H shows step (8) of the method; FIG. 5I shows step (9) of the method; FIG. 5J shows step (10) of the method; FIG. 5K shows step (11) of the method; and FIG. 5L shows step 12 of the method.

Figure 1:
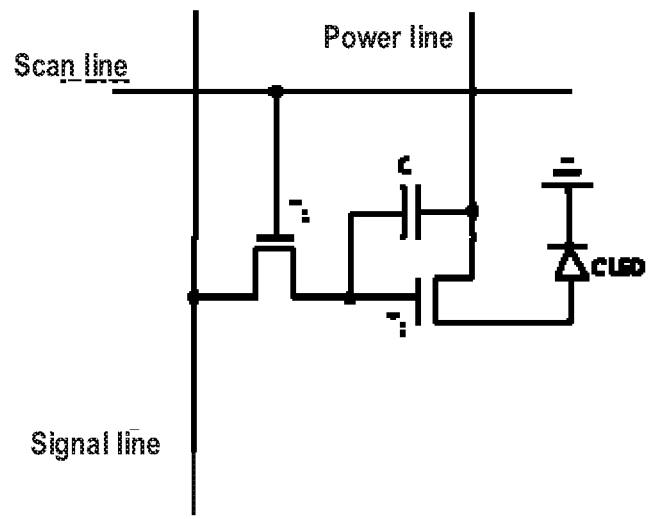
FIG. 1 is a schematic diagram illustrating the composition and connection of the first 2T1C drive circuit provided by the invention.

Reference numbers used in the figures refer to the following structures: 1—first electrode; 2—second electrode; 3—first semiconductor layer; 4—insulating layer; 5—first gate; 6—third electrode; 7—fourth electrode; 8—second semiconductor layer; 9—insulating layer; 10—second gate; 101—glass substrate; 102—metal or metal alloy; 103—insulating layer; 104—inorganic semiconductor layer; 105—metal; 106—insulating layer; 107—organic semiconductor layer; 108—metal or metal alloy; 109—dielectric layer; 110—transparent conductive metal or semiconductor; 111—OLED layer without electrodes; 112—metal or metal alloy; and 113—package.

DETAILED DESCRIPTION OF THE INVENTION

A first aspect of the invention provides an active-matrix driving organic light-emitting diode drive circuit comprising a switch transistor $T_1$, a drive transistor $T_2$, a storage capacitor C, and an organic light-emitting diode OLED, wherein a semiconductor layer of the switch transistor $T_1$ is of an inorganic semiconductor material, and a semiconductor layer of the drive transistor $T_2$ is of an organic semiconductor material.

In the active-matrix driving organic light-emitting diode drive circuit, each of the switch transistor $T_1$ and the drive transistor $T_2$ has three electrodes, specifically including a gate, a first electrode, and a second electrode; the storage capacitor C has two electrodes, a first electrode and a second electrode; the OLED has two electrodes, a first electrode and a second electrode.

The inorganic semiconductor material constituting the switch transistor $T_1$ is not particularly limited in the invention. Preferably, examples of the inorganic semiconductor material useful for the semiconductor layer of the switch transistor $T_1$ of the invention comprises, but is not limited to, any of polysilicon, microcrystalline silicon, amorphous silicon, a compound semiconductor.

Unless otherwise indicated, the term "compound semiconductor" herein means that the semiconductor is an inorganic compound composed of two or more chemical elements, including, but not limited to, zinc oxide (ZnO), indium gallium zinc oxide (InGaZnO).

The organic semiconductor material constituting the drive transistor $T_2$ is not particularly limited in the invention. Preferably, the organic semiconductor material useful for the drive transistor $T_2$ of the invention may be an organic small molecule semiconductor and a polymer semiconductor. Preferably, examples of the organic semiconductor material useful for the drive transistor $T_2$ of the invention comprise, but are not limited to, rubrene, stannum dichlorine phthalocyanine, polythiophene (P3HT), etc.

Preferably, the semiconductor layer of the drive transistor $T_2$ of the invention is fabricated by weak epitaxy growth. While not being bound by any theory, it is believed that the organic semiconductor transistors fabricated by weak epitaxy growth have good device uniformity and process reproducibility.

In the invention, "weak epitaxy growth" generally applies vacuum evaporation. An inducer layer is deposited on a substrate, and then an organic semiconductor material is deposited on the inducer layer, such that the π-π conjugation direction among organic semiconductor molecules is parallel to the surface of the substrate. In the meantime, a high-performance organic semiconductor layer is obtained by taking advantage of the epitaxial relationship or orientation relationship existing between the inducer layer lattices and the organic semiconductor lattices.

By applying the drive circuit of the first aspect of the present application, stable and uniform current signals are obtained. While not being hound by any theory, it is believed that this is because the two transistors, the switch transistor $T_1$ and the drive transistor $T_2$, have different functions during the conversion of voltage signals to current signals by the 2T1C circuit, and thus the requirements on transistor performance are different. Transistors made of the same material cannot meet the different needs of both $T_1$ and $T_2$. In the present application, two different materials are used for the switch transistor $T_1$ and the drive transistor $T_2$, respectively. That is, the semiconductor layer of the switch transistor $T_1$ is of an inorganic semiconductor material, and the semiconductor layer of the drive transistor $T_2$ is of an organic semiconductor material. Therefore, the new 2T1C circuit of the present application can convert input voltage signals to stable and uniform current signals such that the brightness of each unit pixel on the display screen is uniform.

The new 2T1C circuit of the invention may allow the brightness of each cell pixel on a large size (e.g., 370 mm×470 mm) AMOLED display screen to be uniform.

Preferably, the switch transistor $T_1$ and the drive transistor $T_2$ can transport different types of carriers (electrons or holes), respectively.

The invention further provides connection modes of the organic light-emitting diode drive circuit of the first aspect. See FIGS. 1 and 2 for details. In the drawings, $T_1$ denotes a switch transistor, $T_2$ denotes a drive transistor, C denotes a storage capacitor, and OLED denotes an organic light-emitting diode.

According to an embodiment, a first connection mode is shown in FIG. 1: a gate of the switch transistor $T_1$ is connected with a scan line, a first electrode of the switch transistor $T_1$ is connected with a signal line, a second electrode of the switch transistor $T_1$ is connected with both a gate of the drive transistor $T_2$ and a first electrode of the storage capacitor C, a first electrode of the drive transistor $T_2$ is connected with both a second electrode of the storage capacitor C and a power line, and a second electrode of the drive transistor $T_2$ is connected with a first electrode of the OLED.

Figure 2:
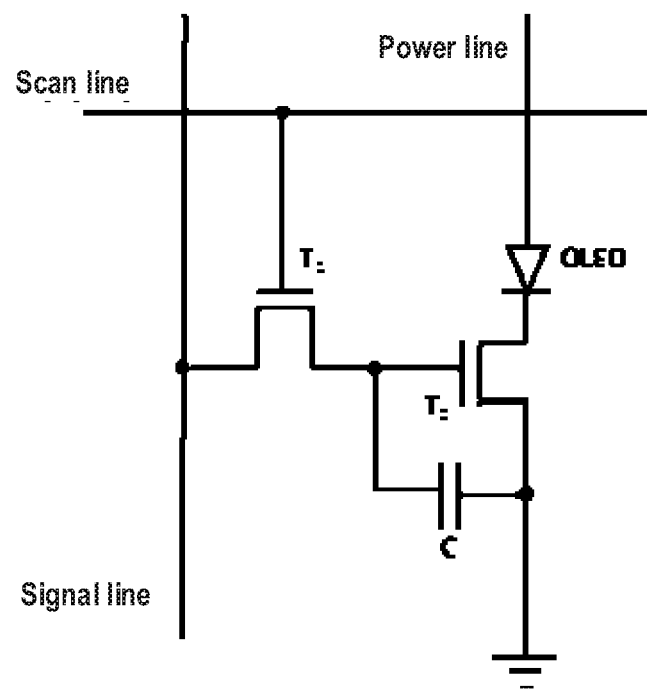
FIG. 2 is a schematic diagram illustrating the composition and connection of the second 2T1C drive circuit provided by the invention.
Figure 3:
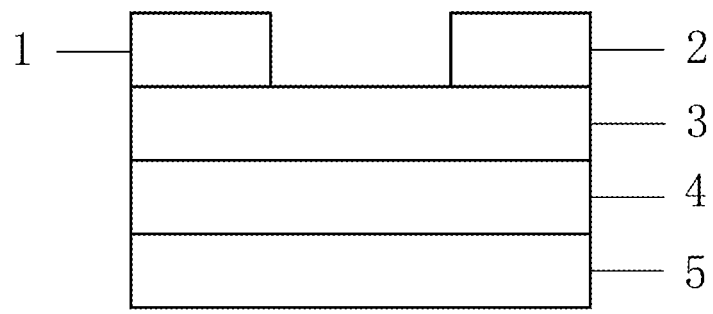
FIG. 3 shows the structure of the switch transistor according to the present invention.
Figure 4:
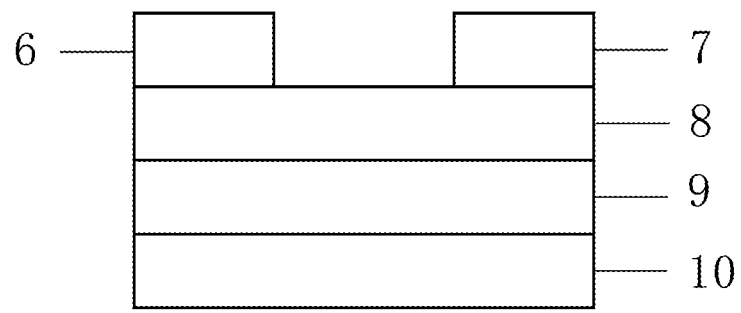
FIG. 4 shows the structure of the drive transistor according to the present invention.
Figure 5A:
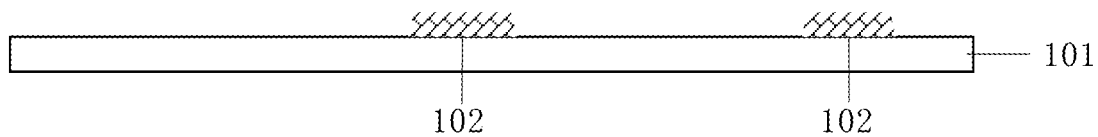
FIGS. 5A to 5L show the steps of the method for fabricating the organic light-emitting diode drive circuit according to the detailed description of the present invention, where
Figure 5B:
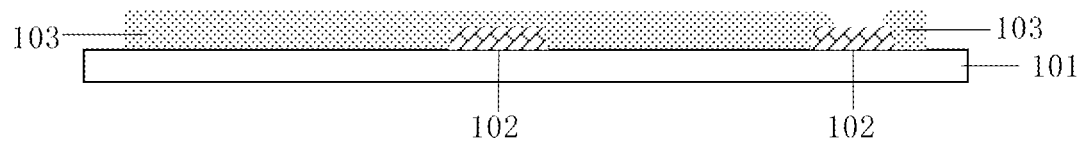
Figure 5C:
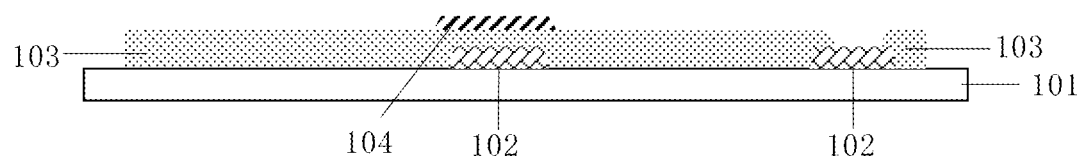
Figure 5D:
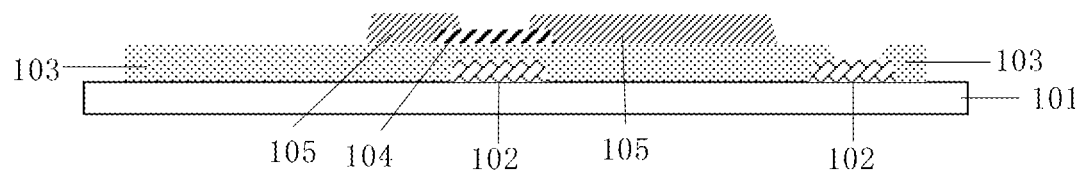
Figure 5E:
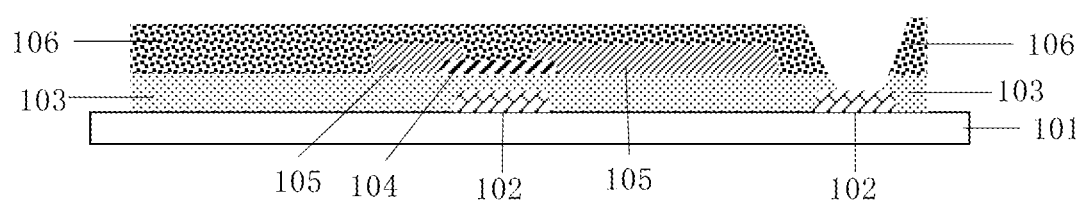
Figure 5F:
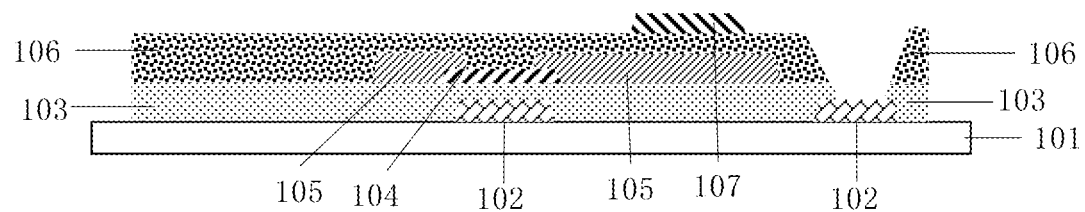
Figure 5G:
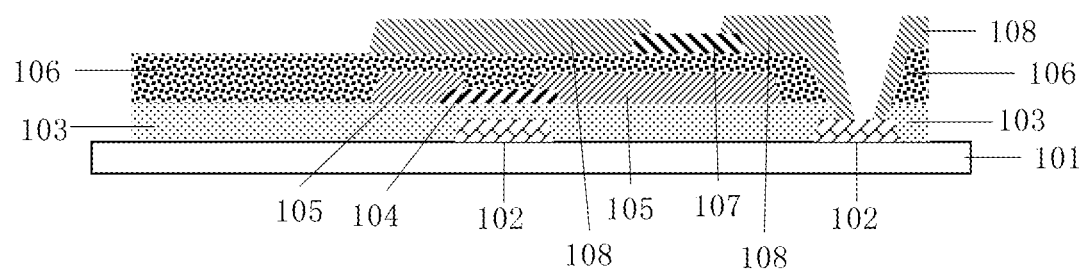
Figure 5H:
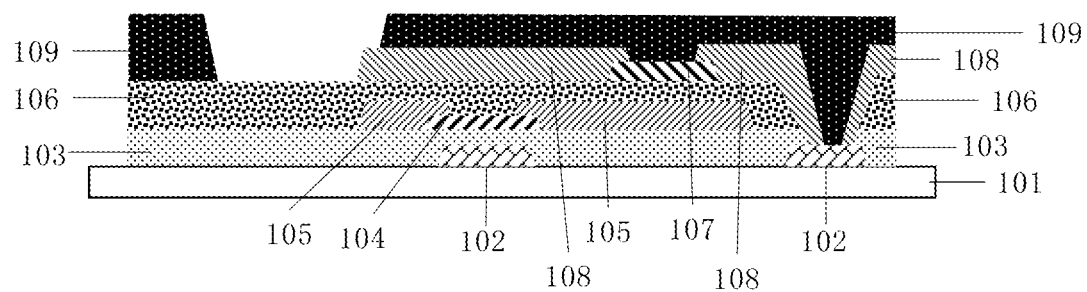
Figure 5I:
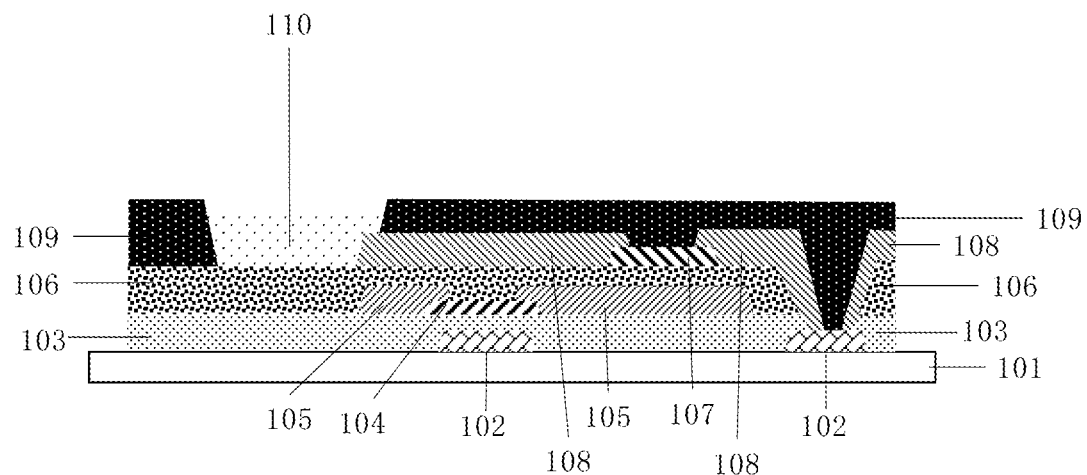
Figure 5J:
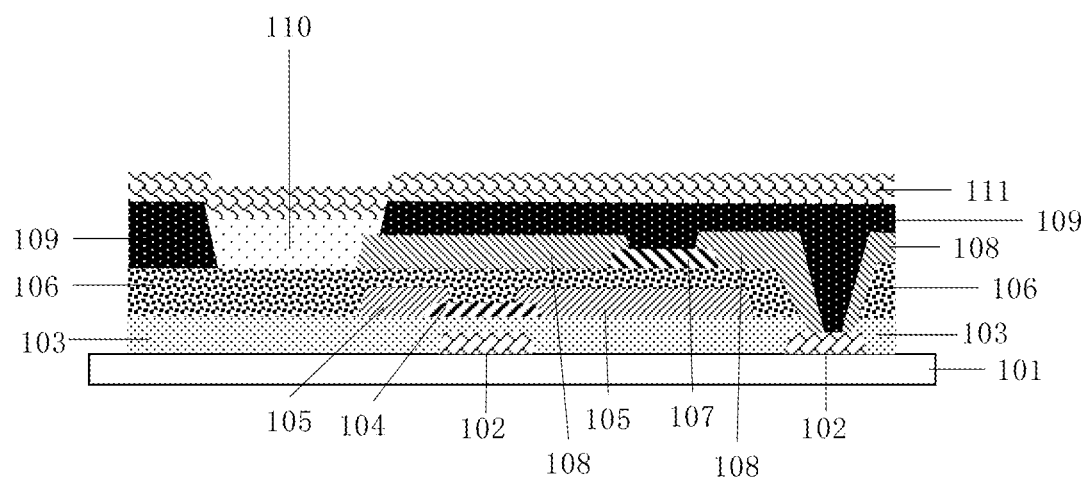
Figure 5K:
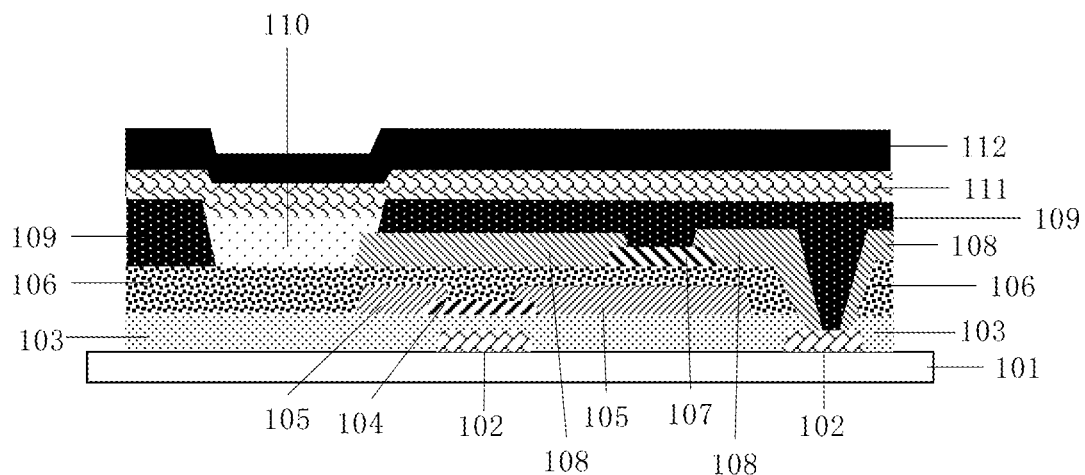
Figure 5L:
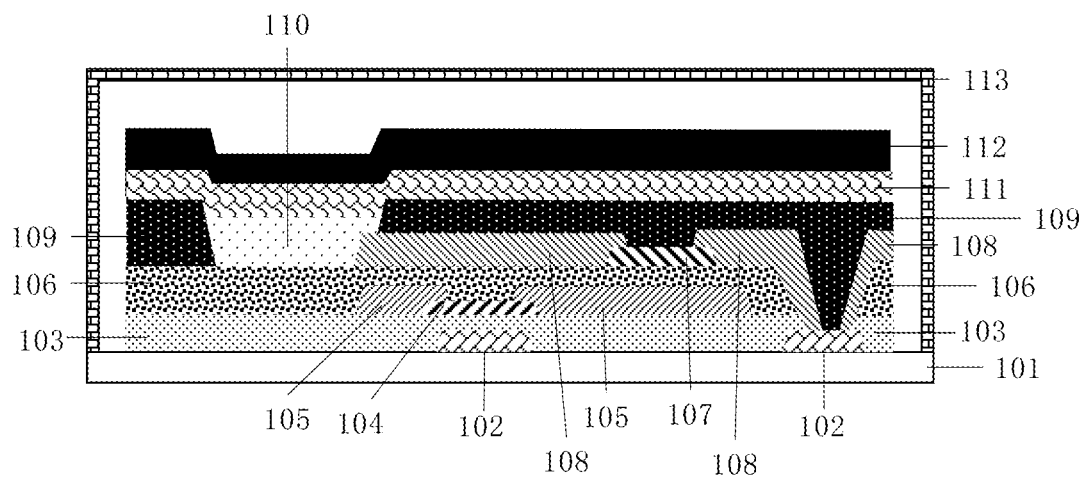

According to another embodiment, a second connection mode is shown in FIG. 2: a gate of the switch transistor $T_1$ is connected with a scan line, a first electrode of the switch transistor $T_1$ is connected with a signal line, a second electrode of the switch transistor $T_1$ is connected with both a gate of the drive transistor $T_2$ and a first electrode of the storage capacitor C, a first electrode of the drive transistor $T_2$ is connected with a second electrode of the storage capacitor C, a second electrode of the drive transistor $T_2$ is connected with a first electrode of the OLED, and a second electrode of the OLED is connected with a power line.

A second aspect of the invention further provides a method of fabricating the above organic light-emitting diode drive circuits.

For the first connection mode above, the following method can be used for fabrication:

(1) depositing one or more layers of a conductive metal or metal alloy on a glass substrate by magnetron sputtering; processing the conductive metal or metal alloy into a desired pattern as the scan line and the gate of the switch transistor $T_1$ by mask lithography;

(2) processing an insulating layer by magnetron sputtering or chemical vapor deposition, and forming a via by mask lithography;

(3) fabricating an inorganic semiconductor layer by methods such as magnetron sputtering or chemical vapor deposition or solution processing, and proceeding the inorganic semiconductor layer into a desired pattern as the semiconductor layer of the switch transistor $T_1$ by mask lithography;

(4) depositing a layer of a conductive metal by magnetron sputtering, processing the conductive metal into a desired pattern as the signal line, the power line, the first electrode and the second electrode of the switch transistor $T_1$, the first electrode of the storage capacitor C, and the gate of the drive transistor $T_2$ by mask lithography;

(5) processing an insulating layer by magnetron sputtering or chemical vapor deposition, and forming a via by mask lithography;

(6) fabricating an organic semiconductor layer by weak epitaxy growth, processing the organic semiconductor layer into a desired pattern as the semiconductor layer of the drive transistor $T_2$ by mask lithography;

(7) fabricating a layer of a conductive metal or metal alloy by techniques such as physical vapor deposition or magnetron sputtering, and fabricating the conductive metal or metal alloy into a desired pattern as the first electrode and the second electrode of the drive transistor $T_2$ and the second electrode of the storage capacitor C by mask lithography;

(8) fabricating a dielectric layer by methods such as magnetron sputtering or chemical vapor deposition or physical vapor deposition or solution processing, and processing the dielectric layer to form a via by mask photolithography, so as to connect the second electrode of the drive transistor $T_2$ with the first electrode of the OLED;

(9) depositing a layer of a transparent conductive metal or semiconductor by techniques such as magnetron sputtering or solution processing, and processing the transparent conductive metal or semiconductor into a desired pattern as the first electrode of the OLED by mask lithography;

(10) forming a semiconductor layer of the OLED by methods such as physical vapor deposition or solution processing or inkjet printing;

(11) fabricating a layer of a conductive metal or metal alloy as the second electrode of the OLED by techniques such as physical vapor deposition or magnetron sputtering; and

(12) integrally packaging the AMOLED display screen.

For the second connection mode above, the following method can be used for fabrication:

(1) depositing one or more layers of a conductive metal or metal alloy on a glass substrate by magnetron sputtering; processing the conductive metal or metal alloy into a desired pattern as the scan line and the gate of the switch transistor $T_1$ by mask lithography;

(2) processing an insulating layer by magnetron sputtering or chemical vapor deposition, and forming a via by mask lithography;

(3) fabricating an inorganic semiconductor layer by methods such as magnetron sputtering or chemical vapor deposition or solution processing, and proceeding the inorganic semiconductor layer into a desired pattern as the semiconductor layer of the switch transistor $T_1$ by mask lithography;

(4) depositing a layer of a conductive metal by magnetron sputtering, processing the conductive metal into a desired pattern as the signal line, the power line, the first electrode and the second electrode of the switch transistor $T_1$, the first electrode of the storage capacitor C, and the gate of the drive transistor $T_2$ by mask lithography;

(5) processing an insulating layer by magnetron sputtering or chemical vapor deposition, and forming a via by mask lithography;

(6) fabricating an organic semiconductor layer by weak epitaxy growth, processing the organic semiconductor layer into a desired pattern as the semiconductor layer of the drive transistor $T_2$ by mask lithography;

(7) fabricating a layer of a conductive metal or metal alloy by techniques such as physical vapor deposition or magnetron sputtering, and fabricating the conductive metal or metal alloy into a desired pattern as the first electrode and the second electrode of the drive transistor $T_2$ and the second electrode of the storage capacitor C by mask lithography;

(8) fabricating a dielectric layer by methods such as magnetron sputtering or chemical vapor deposition or physical vapor deposition or solution processing, and processing the dielectric layer to form a via by mask photolithography, so as to connect the second electrode of the drive transistor $T_2$ with the first electrode of the OLED;

(9) depositing a layer of a conductive metal or metal alloy by techniques such as physical vapor deposition or magnetron sputtering, and processing the conductive metal or metal alloy into a desired pattern as the first electrode of the OLED by mask lithography;

(10) forming a semiconductor layer of the OLED by methods such as physical vapor deposition or solution processing or inkjet printing;

(11) depositing a layer of a transparent conductive metal or semiconductor as the second electrode of the OLED by techniques such as magnetron sputtering or physical vapor deposition; and

(12) integrally packaging the AMOLED display screen.

The methods of fabricating the organic light-emitting diode drive circuit is not limited to the methods introduced above. Any method known in the art that can be used to fabricate an organic light-emitting diode drive circuit can be employed.

The invention further provides a display device comprising an AMOLED, wherein the above active-matrix driving organic light-emitting diode drive circuit is used as the unit pixel of the AMOLED. The term "unit pixel" herein means that an AMOLED display screen is composed of several regions capable of independently emitting light, and each of the smallest regions capable of independently emitting light is referred to as a unit pixel.

In certain embodiments, the display device provided by the invention is a large size display device. In the invention, the "large size" display device means a size of, for example, larger than 370 mm×470 mm, including, for example, but not limited to, a computer monitor, a television set, etc. The "large size" herein means that, the size of a substrate is not less than 370 mm×470 mm. A substrate may be used as a display screen, e.g., a display screen for computers and televisions, or, as needed, split into several or even dozens of small display screens, e.g., display screens for mobile phones and tablet computers).

EXAMPLES

The invention will be further described in detail below in conjunction with the drawings and specific examples in order for those skilled in the art to better understand the invention. Unless otherwise indicated, all the contents, proportions, and parts in the description are expressed by weight, and all the units are International Standard Units.

The materials and test equipment used in the invention are as follows:
Materials The metals and inorganic semiconductors used were provided by Truly Semiconductor;

The organic semiconductors used were purchased from Jilin OLED company.
Test Equipment Two-dimensional color brightness meter: CA2000, Minolta.
Brightness Test Procedure A sample was connected with a peripheral test circuit to make the sample display a single color. The sample was integrally sampled by using CA2000 brightness meter, and the collected data was analyzed by the software of the brightness meter to obtain the brightness at different positions of the sample.

Example 1

For the 2T1C circuit shown in FIG. 1, the specific fabrication process was as follows:

(1) Molybdenum-aluminum-molybdenum was sequentially deposited on a glass substrate by magnetron sputtering; the molybdenum-aluminum-molybdenum was processed into a desired pattern as the scan line and the gate of the switch transistor $T_1$ by mask lithography. The vacuum degree was $10^{-2}$ Pa, the flow rate of argon gas was 200 sccm; the sputtering rate was 300 nm/min, and the thicknesses of the metal layers were 50 nm, 150 nm, and 50 nm, respectively;

(2) A silicon nitride insulating layer was processed by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min the film thickness was 350 nm; a via was formed on the silicon nitride insulating layer by mask lithography;

(3) An amorphous silicon semiconductor layer was fabricated by plasma chemical vapor deposition, wherein the radio frequency was 1156 MHz, the vacuum degree was 60-120 Pa, the substrate temperature was 250° C., the flow rate of silane was 160 sccm, the film forming rate was 20 nm/min, and the film thickness was 200 nm; the amorphous silicon semiconductor layer was processed into a desired pattern as the semiconductor layer of the switch transistor $T_1$ by mask lithography, wherein the amorphous silicon can transport electrons;

(4) A layer of metal molybdenum was deposited by magnetron sputtering, wherein the vacuum degree was $10^{-2}$ Pa, the flow rate of argon gas was 200 sccm, the sputtering rate was 300 nm/min, and the film thickness was 250 nm; the metal molybdenum was processed into a desired pattern as the signal line, the power line, the first electrode and the second electrode of the switch transistor $T_1$, the first electrode of the storage capacitor C, and the gate of the drive transistor $T_2$ by mask lithography;

(5) A silicon nitride insulating layer was processed by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min, and the film thickness was 200 nm; a via was formed on the silicon nitride insulating layer by mask lithography;

(6) A rubrene organic semiconductor layer was fabricated by weak epitaxy growth using hexaphenyl as an inducer layer, wherein the vacuum degree was $8\times10^{-4}$ Pa, the substrate temperature was 180° C., the deposition rate was 1 nm/min, the thickness of hexaphenyl was 5 nm, and the thickness of rubrene was 20 nm; the rubrene organic semiconductor layer was processed into a desired pattern as the semiconductor layer of the drive transistor $T_2$ by mask lithography, wherein the rubrene can transport cavities;

(7) A layer of metal gold was fabricated by vacuum vapor deposition, wherein the vacuum degree was $8\times10^{-4}$ Pa, the deposition rate was 50 nm/min, and the thickness was 100 nm; the metal gold was processed into a desired pattern as the first electrode and the second electrode of the drive transistor $T_2$ and the second electrode of the storage capacitor C by mask lithography;

(8) A silicon nitride dielectric layer was fabricated by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min, and the film thickness was 200 nm; the silicon nitride dielectric layer was processed to form a via by mask photolithography, so as to connect the second electrode of the drive transistor $T_2$ with the first electrode of the OLED;

(9) A layer of iridium tin oxide (ITO) was deposited by magnetron sputtering, wherein the vacuum degree was $10^{-2}$ Pa, the flow rate of carrier gas was 200 sccm, the sputtering rate was 150 nm/min, and the thickness was 75 nm; the ITO was processed into a desired pattern as the first electrode of the OLED by mask lithography;

(10) N,N'-diphenyl-N,N'-(1-naphthyl)1,1'biphenyl-4,4'-diamine (NPB) and 8-hydroxyquinoline aluminum (Alq3) were processed by physical vapor deposition to form the semiconductor layer of the OLED, wherein the vacuum degree was $8\times10^{-4}$ Pa, the deposition rate was 10 nm/min, the thickness of NPB was 40 nm, and the thickness of Alq3 was 50 nm;

(11) A layer of metal aluminum was fabricated as the second electrode of the OLED by physical vapor deposition, wherein the vacuum degree was $8\times10^{-4}$ Pa, the deposition rate was 50 nm/min, and the thickness was 100 nm;

(12) The AMOLED display screen was integrally packaged.

Among the 5 batches of products, 5 samples were randomly selected from each batch, and each sample was 370 mm×470 mm in size. The peak brightness was 400±23 cd/m², and the number of dead pixels per sample was not more than three. The samples were evenly divided into 9 regions by 3×3. Each of the regions was tested for brightness. When the average brightness was 220 cd/m², the error of the brightness of the regions was less than 7%. After 10,000 iterations of turning on and off, the brightness was not changed.

The test results showed that the batch stability, the process reliability, and the stability and uniformity of display brightness of the display screen products using the AMOLEDs based on the 2T1C circuits provided by the invention satisfied the requirements of current commercial products.

Example 2

For the 2T1C circuit shown in FIG. 2, the specific fabrication process was as follows:

(1) A layer of metal molybdenum was deposited on a glass substrate by magnetron sputtering, wherein the vacuum degree was $10^{-2}$ Pa, the flow rate of argon gas was 200 sccm, the sputtering rate was 300 nm/min, and the thicknesses were 300 nm; the metal molybdenum was processed into a desired pattern as the scan line and the gate of the switch transistor $T_1$ by mask lithography;

(2) A silicon nitride insulating layer was processed by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min. the film thickness was 350 nm; a via was formed on the silicon nitride insulating layer by mask lithography;

(3) An amorphous silicon semiconductor layer was fabricated by plasma chemical vapor deposition, wherein the radio frequency was 13.56 MHz, the vacuum degree was 60-120 Pa, the substrate temperature was 250° C., the flow rate of silane was 160 sccm, the film forming rate was 20 nm/min, and the film thickness was 200 nm; the amorphous silicon was converted to polycrystalline silicon by laser scanning annealing, wherein the substrate temperature was 435° C.; the amorphous silicon semiconductor layer was processed into a desired pattern as the semiconductor layer of the switch transistor $T_1$ by mask lithography, wherein the amorphous silicon can transport cavities;

(4) A layer of metal molybdenum was deposited by magnetron sputtering, wherein the vacuum degree was $10^{-2}$ Pa, the flow rate of argon gas was 200 sccm, the sputtering rate was 300 nm/min, and the thickness was 250 nm; the metal molybdenum was processed into a desired pattern as the signal line, the power line, the first electrode and the second electrode of the switch transistor $T_1$, the first electrode of the storage capacitor C, and the gate of the drive transistor $T_2$ by mask lithography;

(5) A silicon nitride insulating layer was processed by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min, and the film thickness was 200 nm; a via was formed on the silicon nitride insulating layer by mask lithography;

(6) A stannum dichlorine phthalocyanine organic semiconductor layer was fabricated by weak epitaxy growth using hexaphenyl as an inducer layer, wherein the vacuum degree was $8\times10^{-4}$ Pa, the substrate temperature was 180° C., the deposition rate was 1 nm/min, the thickness of hexaphenyl was 5 nm, and the thickness of stannum dichlorine phthalocyanine was 30 nm; it was processed into a desired pattern as the semiconductor layer of the drive transistor $T_2$ by mask lithography, wherein the stannum dichlorine phthalocyanine can transport electrons;

(7) A layer of metal silver was fabricated by physical vapor deposition, wherein the vacuum degree was $8\times10^{-4}$ Pa, the deposition rate was 50 nm/min, and the thickness was 100 nm; the metal silver was processed into a desired pattern as the first electrode and the second electrode of the drive transistor $T_2$ and the second electrode of the storage capacitor C by mask lithography;

(8) A silicon nitride dielectric layer was fabricated by chemical vapor deposition, wherein the vacuum degree was 266 Pa, the flow rate of silane was 250 sccm, the flow rate of ammonia gas was 1550 sccm, the flow rate of nitrogen gas was 1550 sccm, the flow rate of hydrogen gas was 250 sccm, the power was 1800 W, the film forming rate was 380 nm/min, and the film thickness was 200 nm; the silicon nitride dielectric layer was processed to form a via by mask photolithography, so as to connect the second electrode of the drive transistor $T_2$ with the first electrode of the OLED;

(9) A layer of metal aluminum was deposited by magnetron sputtering, wherein the vacuum degree was $10^{-2}$ Pa, the flow rate of argon gas was 200 sccm, the sputtering rate was 300 nm/mm, and the thickness was 300 nm; the metal aluminum was processed into a desired pattern as the first electrode of the OLED by mask lithography;

(10) N,N'-diphenyl-N,N'-(1-naphthyl)1,1'biphenyl-4,4'-diamine (NPB) and 8-hydroxyquinoline aluminum (Alq3) were processed by mask physical vapor deposition to form the semiconductor layer of the OLED, wherein the vacuum degree was $8\times10^{-4}$ Pa, the deposition rate was 10 nm/min, the thickness of NPB was 40 nm, and the thickness of Alq3 was 50 nm;

(11) A layer of metal aluminum doped zinc oxide was fabricated as the second electrode of the OLED by magnetron sputtering, wherein the vacuum degree was $10^{-2}$ Pa, the flow rate of argon gas was 200 sccm, the sputtering rate was 150 nm/min, and the thickness was 80 nm;

(12) The AMOLED display screen was integrally packaged.

Among the 5 hatches of products, 5 samples were randomly selected from each batch, and each sample was 370 min×470 mm in size. The peak brightness was 400±18 cd/m², and the number of dead pixels per sample was not more than three. The samples were evenly divided into 9 regions by 3×3. Each of the regions was tested for brightness. When the average brightness was 220 cd/m², the error of the brightness of the regions was less than 6.7%. After 10,000 iterations of turning on and off, the brightness was not changed.

The test results showed that the batch stability, the process reliability, and the stability and uniformity of display brightness of the display screen products using the AMOLEDs based on the 2T1C circuits provided by the invention satisfied the requirements of current commercial products.

The foreseeable variations and modifications of the invention will be obvious to those skilled in the art without departing from the scope and spirit of the invention. For illustrative purposes, the invention should not be limited to the examples set forth in this patent application. The present specification shall prevail in the event of a conflict or inconsistency between the present specification and the disclosure of any document incorporated herein by reference.

The invention claimed is:

1. A method for fabricating an organic light-emitting diode drive circuit, comprising:
    depositing one or more layers of a conductive metal or metal alloy on a glass substrate by magnetron sputtering; processing the conductive metal or metal alloy into a desired pattern as a scan line and a first gate of a switch transistor ($T_1$) by mask lithography;
    processing an insulating layer by magnetron sputtering or chemical vapor deposition, and forming a via by mask lithography;
    fabricating an inorganic semiconductor layer by magnetron sputtering, chemical vapor deposition, or solution processing, and proceeding the inorganic semiconductor layer into a desired pattern as a first semiconductor layer of the switch transistor ($T_1$) by mask lithography;
    depositing a layer of a conductive metal by magnetron sputtering, processing the conductive metal into a desired pattern as a signal line, a power line, a first electrode and a second electrode of the switch transistor ($T_1$), a first electrode of a storage capacitor (C), and a second gate of a drive transistor ($T_2$) by mask lithography;
    processing an insulating layer by magnetron sputtering or chemical vapor deposition, and forming a via by mask lithography;
    fabricating an organic semiconductor layer by weak epitaxy growth, processing the organic semiconductor layer into a desired pattern as a second semiconductor layer of the drive transistor ($T_2$) by mask lithography;
    fabricating a layer of a conductive metal or metal alloy by physical vapor deposition or magnetron sputtering, and fabricating the conductive metal or metal alloy into a desired pattern as a third electrode and a fourth electrode of the drive transistor ($T_2$) and a second electrode of the storage capacitor (C) by mask lithography;
    fabricating a dielectric layer by magnetron sputtering, chemical vapor deposition, physical vapor deposition, or solution processing, and processing the dielectric layer to form a via by mask photolithography, so as to connect the fourth electrode of the drive transistor ($T_2$) with a first electrode of an organic light-emitting diode;
    depositing a layer of a transparent conductive metal or semiconductor by magnetron sputtering or solution processing, and processing the transparent conductive metal or semiconductor into a desired pattern as the first electrode of the organic light-emitting diode by mask lithography;
    forming a semiconductor layer of the organic light-emitting diode by physical vapor deposition, solution processing, or inkjet printing;
    fabricating a layer of a conductive metal or metal alloy as a second electrode of the organic light-emitting diode by physical vapor deposition or magnetron sputtering; and
    integrally packaging an active-matrix driving organic light-emitting diode display screen,
    wherein the organic light-emitting diode drive circuit comprises the switch transistor comprising the first electrode, the second electrode, the first gate, and the first semiconductor layer, and the first semiconductor layer carries flow between the first electrode and the second electrode, and the first semiconductor layer consists of an inorganic semiconductor material; the drive transistor comprising the third electrode, the fourth electrode, the second gate, and the second semiconductor layer, and the second semiconductor layer carries flow between the third electrode and the fourth electrode, and the second semiconductor layer consists of an organic semiconductor material; the storage capacitor, and the organic light-emitting diode; and
    wherein a connection mode of the organic light-emitting diode drive circuit is as follows: the first gate of the switch transistor is connected with the scan line; the first electrode of the switch transistor is connected with the signal line; the second electrode of the switch transistor is connected with both the second gate of the drive transistor and the first electrode of the storage capacitor; the third electrode of the drive transistor is connected with both the second electrode of the storage capacitor and the power line; and the fourth electrode of the drive transistor is connected with the first electrode of the organic light-emitting diode.

2. A method for fabricating an organic light-emitting diode drive circuit, comprising:
    depositing one or more layers of a conductive metal or metal alloy on a glass substrate by magnetron sputtering; processing the conductive metal or metal alloy into a desired pattern as a scan line and a first gate of a switch transistor ($T_1$) by mask lithography;
    processing an insulating layer by magnetron sputtering or chemical vapor deposition, and forming a via by mask lithography;
    fabricating an inorganic semiconductor layer by magnetron sputtering, chemical vapor deposition, or solution processing, and proceeding the inorganic semiconductor layer into a desired pattern as a first semiconductor layer of the switch transistor ($T_1$) by mask lithography;
    depositing a layer of a conductive metal by magnetron sputtering, processing the conductive metal into a desired pattern as a signal line, a power line, a first electrode and a second electrode of the switch transistor ($T_1$), a first electrode of a storage capacitor (C), and a second gate of a drive transistor ($T_2$) by mask lithography;
    processing an insulating layer by magnetron sputtering or chemical vapor deposition, and forming a via by mask lithography;
    fabricating an organic semiconductor layer by weak epitaxy growth, processing the organic semiconductor layer into a desired pattern as a second semiconductor layer of the drive transistor ($T_2$) by mask lithography;
    fabricating a layer of a conductive metal or metal alloy by physical vapor deposition or magnetron sputtering, and fabricating the conductive metal or metal alloy into a desired pattern as a third electrode and a fourth electrode of the drive transistor ($T_2$) and a second electrode of the storage capacitor (C) by mask lithography;

fabricating a dielectric layer by magnetron sputtering, chemical vapor deposition, physical vapor deposition, or solution processing, and processing the dielectric layer to form a via by mask photolithography, so as to connect the fourth electrode of the drive transistor ($T_2$) with a first electrode of an organic light-emitting diode;

depositing a layer of a conductive metal or metal alloy by physical vapor deposition or magnetron sputtering, and processing the conductive metal or metal alloy into a desired pattern as the first electrode of the organic light-emitting diode by mask lithography;

forming a semiconductor layer of the organic light-emitting diode by physical vapor deposition, solution processing, or inkjet printing;

depositing a layer of a transparent conductive metal or semiconductor as a second electrode of the organic light-emitting diode by magnetron sputtering or physical vapor deposition; and integrally packaging an active-matrix driving organic light-emitting diode display screen;

wherein the organic light-emitting diode drive circuit comprises the switch transistor comprising the first electrode, the second electrode, the first gate, and the first semiconductor layer, and the first semiconductor layer carries flow between the first electrode and the second electrode, and the first semiconductor layer consists of an inorganic semiconductor material; the drive transistor comprising the third electrode, the fourth electrode, the second gate, and the second semiconductor layer, and the second semiconductor layer carries flow between the third electrode and the fourth electrode, and the second semiconductor layer consists of an organic semiconductor material; the storage capacitor, and the organic light-emitting diode; and wherein a connection mode of the organic light-emitting diode drive circuit is as follows: the first gate of the switch transistor is connected with the scan line; the first electrode of the switch transistor is connected with the signal line; the second electrode of the switch transistor is connected with both the second gate of the drive transistor and the first electrode of the storage capacitor; the third electrode of the drive transistor is connected with the second electrode of the storage capacitor; the fourth electrode of the drive transistor is connected with the first electrode of the organic light-emitting diode, and the second electrode of the organic light-emitting diode is connected with the power line.

* * * * *